United States Patent [19]

Evans, Jr. et al.

[11] Patent Number: 4,654,586

[45] Date of Patent: Mar. 31, 1987

[54] DIGITAL PHASE METER APPARATUS

[75] Inventors: Joseph T. Evans, Jr.; Stacy M. Munechika; Michael C. Norris; Alisa M. Hren; Kevin M. Heck; Suzanne M. Zulka, all of Albuquerque, N. Mex.

[73] Assignee: The United States of America as represented by the Secretary of the Air Force, Washington, D.C.

[21] Appl. No.: 742,826

[22] Filed: Jun. 10, 1985

[51] Int. Cl.⁴ ............................................. G01R 25/08
[52] U.S. Cl. .................................. 324/83 D; 307/516; 324/83 R; 328/134; 328/155
[58] Field of Search ................ 324/83 R, 83 D, 79 D; 307/234, 510, 514, 516; 328/133, 134, 55, 155

[56] References Cited

U.S. PATENT DOCUMENTS

| | | | |
|---|---|---|---|
| 3,469,196 | 9/1969 | Cowin et al. | 328/133 |
| 3,553,579 | 1/1971 | Teixeira | 324/83 |
| 3,663,956 | 5/1972 | Purdy et al. | 328/133 |
| 3,820,022 | 6/1974 | Watt | 324/83 D |
| 3,953,794 | 4/1976 | Moore | 324/83 D |
| 4,025,848 | 5/1977 | Delagrange et al. | 324/83 D |
| 4,070,618 | 1/1978 | Thomas | 324/83 D |
| 4,600,994 | 7/1986 | Hayashi | 328/133 |

Primary Examiner—Michael J. Tokar
Assistant Examiner—Kevin D. O'Shea
Attorney, Agent, or Firm—William Stepanishen; Donald J. Singer

[57] ABSTRACT

A digital phase meter to measure the phase difference between an input signal and a reference signal and output this phase information in the form of an eight bit number. The input signal and the reference signal, which are sinusoidal, are conditioned to a more defined leading edge by a high speed differential voltage comparator and a dual/differential line receiver. A series of uniquely configured D flip-flops are used to detect the leading edge of both the signal input and the reference input. An AND gate then acts as a switch that is activated on the leading edge of the signal input. The time interval between the two positive leading edges of the input signal and reference signal specifies the phase difference. The AND gate is in the high state for this duration. The phase difference is converted into an 8-bit binary number via two 4-bit cascaded counters. The high output of the AND gate is used to enable the counters for the duration of the phase difference.

6 Claims, 7 Drawing Figures

DIGITAL PHASE METER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a phase meter, and in particular to a digital phase meter apparatus.

Phase measurements are utilized to determine the relative times at which alternating currents and voltages in a circuit take on zero values. If two voltages $v_1$ and $v_2$ are zero at the same instant, they are in phase, with zero phase difference (or out of phase with 180° difference). If one voltage $v_1$ passes through zero ⅛ cycle before a second voltage $v_2$, it leads by 360°/8 or 45°. The common phase meter, a commercial device for determining the angle between current and voltage, can be used when its presence will not disturb the circuits under measurement. When phase angles to be measured are in high-impedance or low power circuits, this common device may be unsatisfactory and other measurement methods must be used.

The electronic phase-angle meter provides the angle $(\pi - \theta)$ directly. One such prior art instrument converts the two voltage waves to square waves by repeated amplification and limiting. The zero crossings of the square waves are identical to the zero crossing of the original voltage waves. The two square waves are applied to the input of a circuit that will pass current only when both square waves are positive. In this case the greater the lag of one voltage, the smaller the overlap of the positive portions and the lower the average current. The current in this case is proporational to $\theta$.

This type of circuit has the theoretical limitation that each input voltage must be greater than a critical minimum value. In practice the critical value is determined by the noise on the amplifier input. If the voltage is too low, this noise causes a random zero-crossing shift and the results would be subject to this uncertainty.

A precision phase-angle meter for high frequency voltages uses a variable delay line, and its operation is based on the fact that the difference of two voltages of constant amplitude is a minimum when the two are in phase. One of the two voltages to be compared is connected to both inputs of a variable-delay line, which is then adjusted to give a minimum output. The two voltages to be compared are then connected to the two terminals and the delay line is readjusted to give a minimum output. The change in the delay-line setting indicates the time delay of one voltage relative to the other. When the frequency, is known, the time delay can be computed as angle of lag. If $\Delta t$ is the change in the delay-line setting and the frequency is f hertz, the phase angle is given by $2\pi f \Delta t$ radians or $360 f \Delta t$ degrees.

Some prior art devices for electronically or digitally measuring phase difference are disclosed in the following U.S. Patents. For example, U.S. Pat. No 3,469,196 discloses a circuit for detecting the phase difference between two signals which includes means for squaring the two signals, and, first and second gates connected thereto for developing outputs whenever the two signals are simultaneously negative or positive respectively. U.S. Pat. No. 3,553,579 discloses a circuit for measuring the difference in phase between a reference signal and an unknown sinusoidal signal which includes a digital counter which provides a digital indication of the amount of phase displacement. A couple of references which are cited for general interest are U.S. Pat. Nos. 3,820,022 and 3,953,794 each of which discloses a circuit for measuring the phase difference between two signals.

The present invention, which utilizes a combination of digital elements to perform the function of measuring the phase difference between an input signal and a reference signal, is not disclosed by the prior art.

SUMMARY OF THE INVENTION

The digital phase meter utilizes a digital phase measurement circuit to measure the phase difference between an input signal and a reference signal of the same frequency, and output this phase difference information in the form of an eight bit number. The digital phase meter has control lines which are digitally compatible with microprocessor or computer-based control operations. The digital phase meter utilizes three analog inputs: a clock input, a signal input, and a reference input. The clock input, which can be either sinusoidal or square, is used to synchronize and drive the digital components of the circuit. The signal and reference inputs are the signals whose phase difference is measured. The digital control lines for the digital phase meter are start, clear, read ready, and read data. All control lines are active low and can be sequentially addressed for a digitally controlled phase measurement routine. The digital phase meter is operational for input frequencies of up to 10 MHz and clock frequencies of 40 MHz. The maximum level of precision of the digital phase meter is wavelength $(\lambda)/256$. (The precision is proportional to the signal-to-clock frequency ratio. Greater precision can be realized by cascading counters to accommodate lower signal-to-clock frequency ratios.).

It is one object of the present invention, therefore, to provide an improved digital phase meter apparatus.

It is another object of the invention to provide an improved digital phase meter apparatus which is completely digitally compatible and controllable.

It is another object of the invention to provide an improved digital phase meter apparatus which utilizes leading/lagging signal edge detection and thus is immune to modulo $\pi$ ambiguities It is another object of the invention to provide an improved digital phase meter apparatus which has to 8-bit precision (wavelength, $\lambda/256$).

It is another object of the invention to provide an improved digital phase meter apparatus which is constructed with off-the-shelf, low cost, standard TTL integrated circuit units.

These and other advantages, objects and features of the invention will become more apparent after considering the following description taken in conjunction with the illustrative embodiment in the accompanying drawings

BRIEF DISCRIPTION OF THE DRAWINGS

FIG. 1 is a block diagram of the digital phase meter apparatus according to the present invention, FIG. 2 is a flow diagram for the operation of the digital phase meter apparatus, FIG. 3 is being comprised of FIGS. 3a–3c which are a schematic diagram of the digital phase meter apparatus, and, FIG. 4 is a block diagram of a distance measuring configuration using the digital phase meter apparatus.

DESCRIPTION OF THE PREFERRED EMBODIMENT

Figure 1:
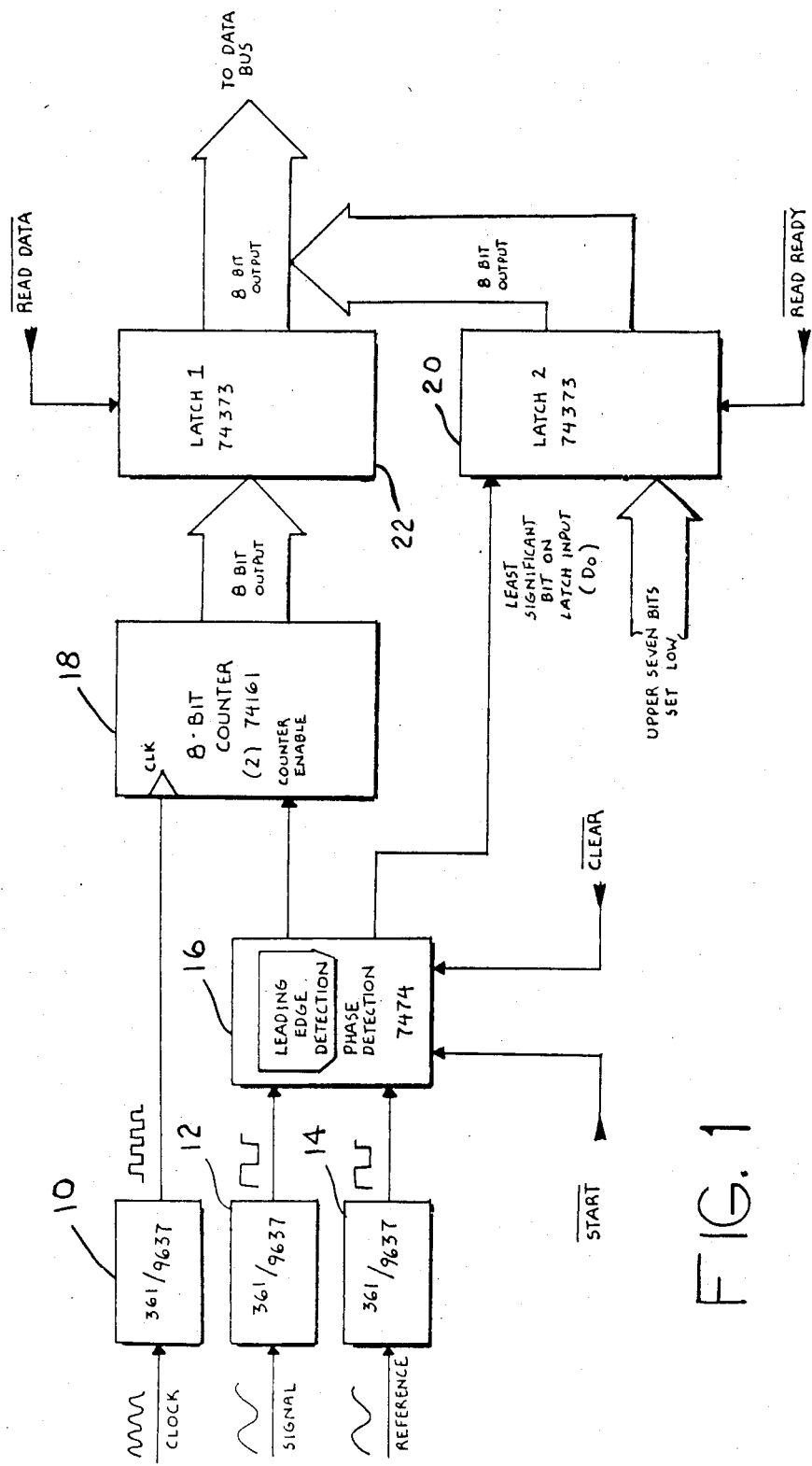
Figure 2:
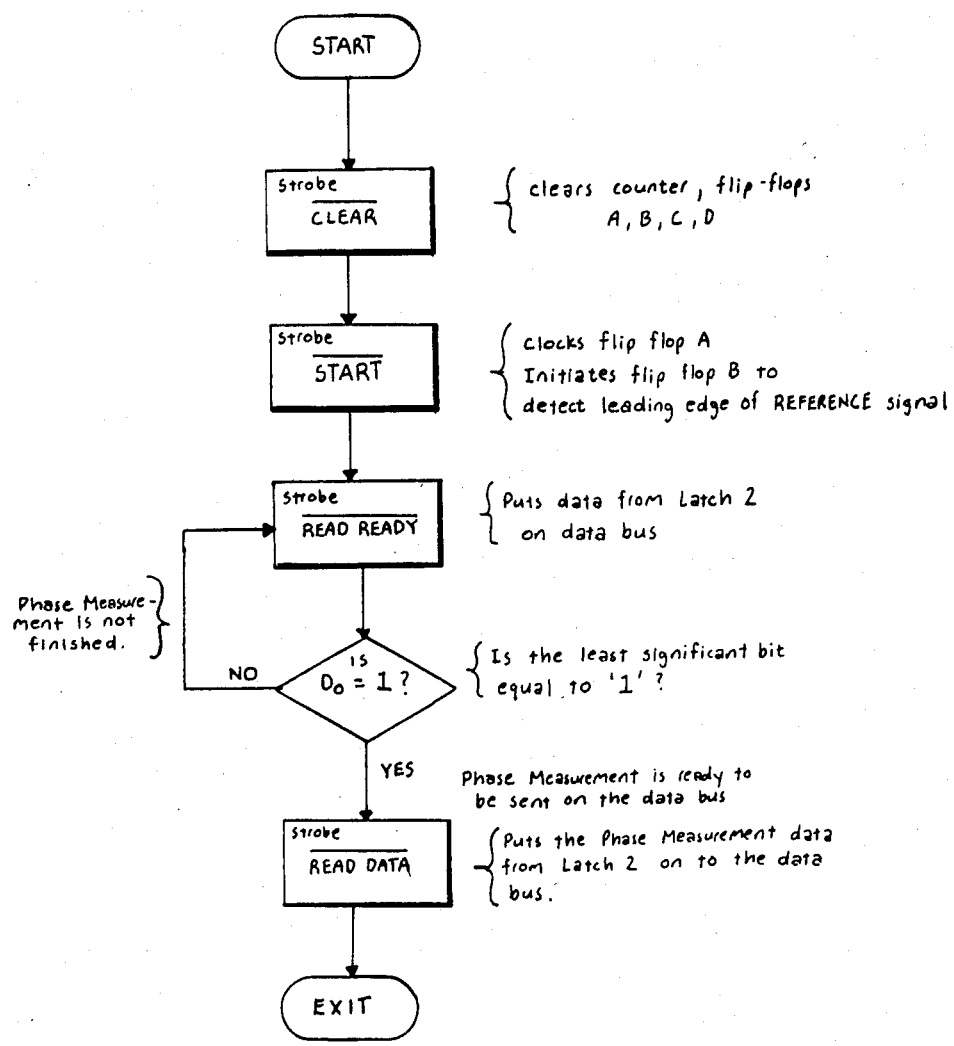

Referring now to FIG. 1 there is shown a block diagram of the digital phase meter apparatus to measure and determine the phase difference between an applied input signal and a reference signal. A plurality of high speed differential voltage amplifier/dual differential line receiver units 10, 12 and 14 which comprise signal squaring units, respectively receive a clock signal, signal under test and a reference signal. The clock signal which is applied to signal squaring unit 10 appears at the output as a square wave which is applied to the clock input of the 8 bit counter unit 18. The output of signal squaring unit 12, which is a square wave representative of the input signal under test, is applied to the leading edge phase detection unit 16. The output of signal squaring unit 14 is a square wave which is representative of the input reference signal and it is applied to the leading edge/phase detection unit 16. The leading edge/phase detection unit 16 receives two control signals, a $\overline{START}$ and a $\overline{CLEAR}$ signal. The leading edge detection portion of unit 16 provides an output signal to the 8 bit counter unit 18 at its counter enable input. The phase detection portion of unit 16 provides an output signal to the input of latch 2 unit number 20. The latch 2 unit 20 receives a control signal entitled "$\overline{READ\ READY}$". The output of the 8 bit counter unit 18 is applied to the latch 1 unit 22. The latch 1 unit 22 receives a control signal entitled "$\overline{READ\ DATA}$". When the read ready signal and the read data signal are respectively applied to latch unit 2 unit 20 and latch unit 1 unit 22, the output from the latch 2 unit 20 is combined with the output of the latch 1 unit 22 and is applied, as shown, to the data bus. However, the data bus will sense the data from only one of the appropriately strobed latches at a time. Turning now to FIG. 2 there is shown a flow diagram of the logical operation steps that occur in the digital phase meter apparatus of FIG. 1. The phase measurement process is initialed by first applying a $\overline{CLEAR}$ signal. The $\overline{CLEAR}$ signal clears the 8-bit counter unit 18 and the leading edge/phase detection unit 16. The $\overline{START}$ signal is applied to the leading edge/phase detection unit 16 to initiate the detection of the leading edge of the reference signal that is utilized to measure the phase deviation therefrom of the signal under test. The $\overline{READ\ READY}$ signal is applied to the latch-2 unit 20 to determine if the phase measurement process is completed. When the latch-2 unit 20 indicates that the phase measurement process has been completed, the $\overline{READ\ DATA}$ signal can be applied to the latch-1 unit 22 which puts the phase measurement data from latch-1 unit 22 onto the data bus line.

Figure 3:
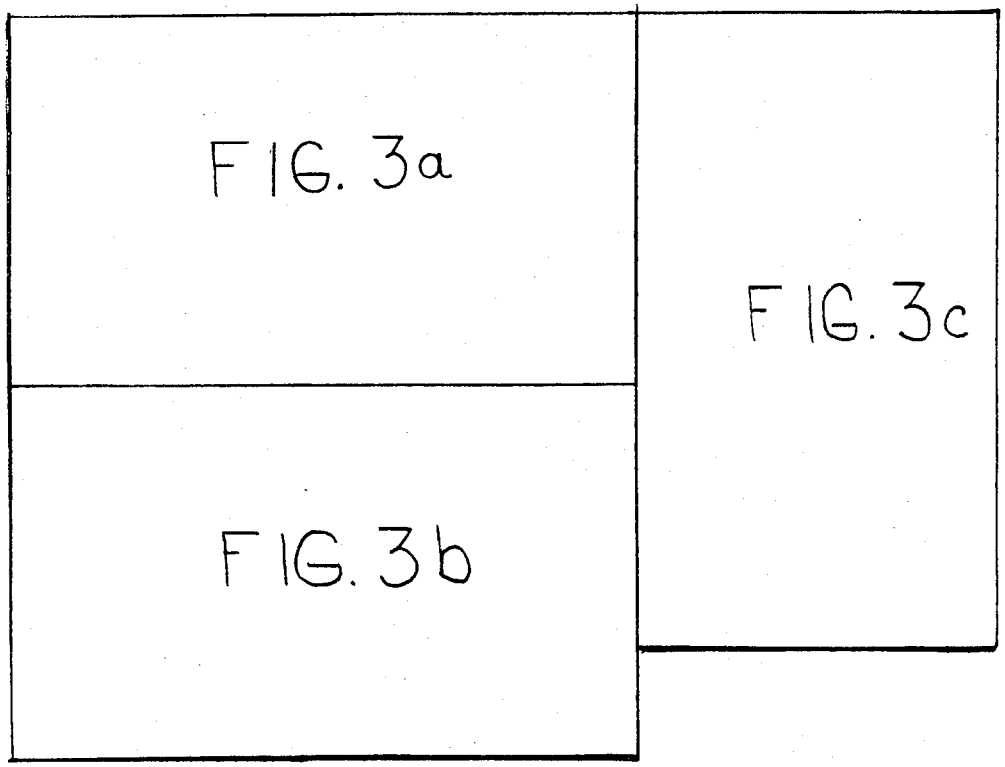
Figure 3A:
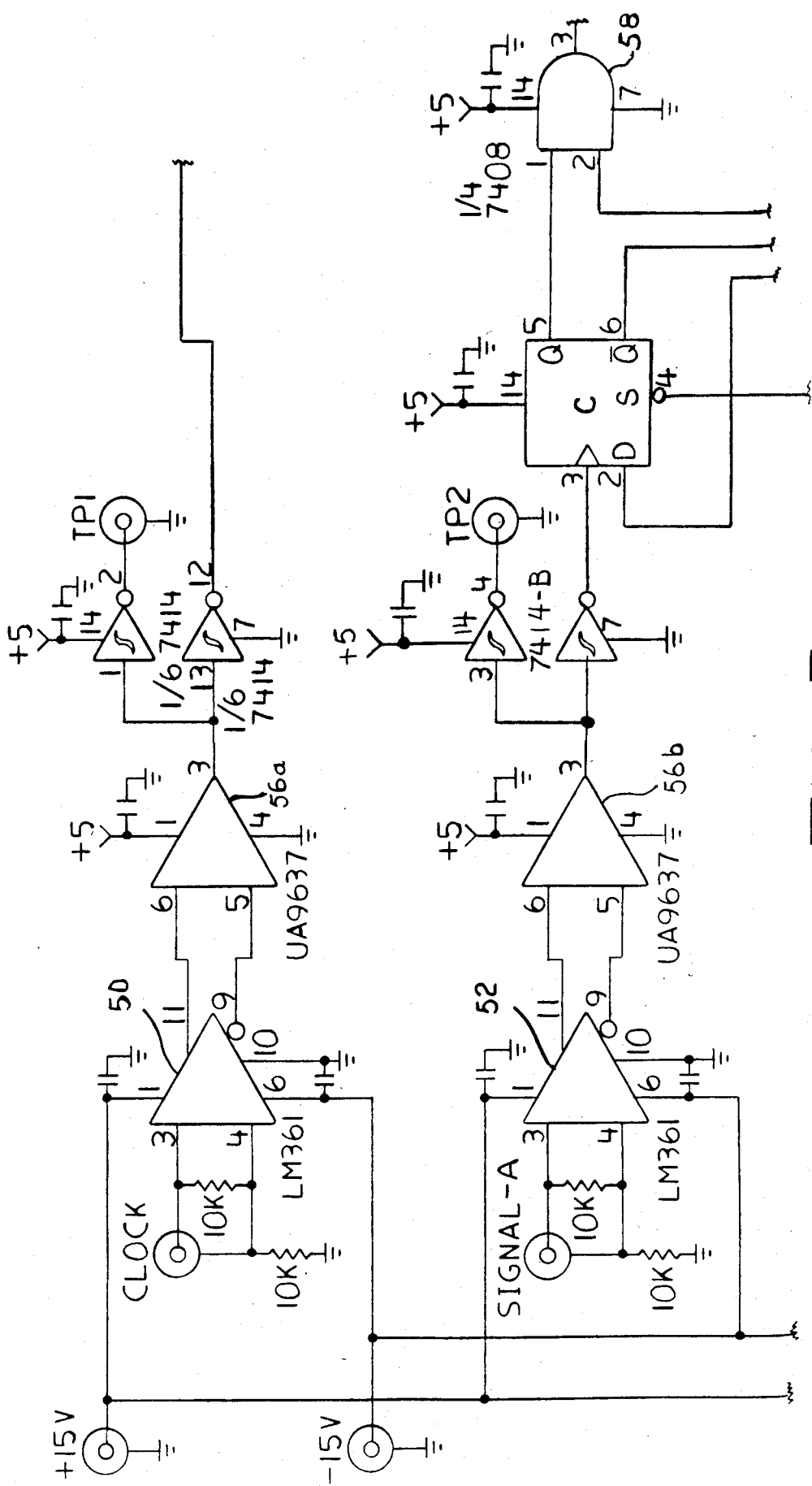
Figure 3B:
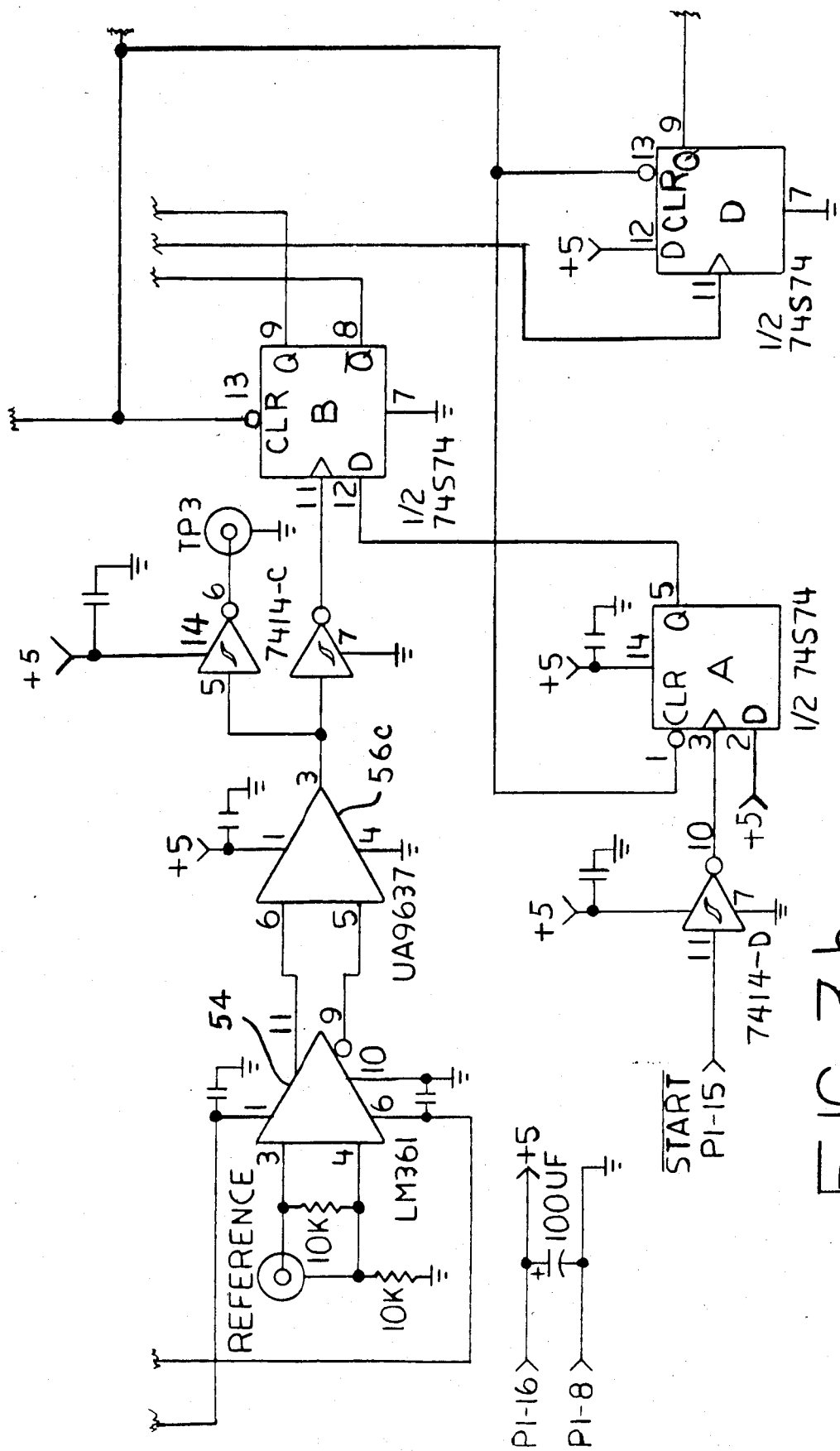
Figure 3C:
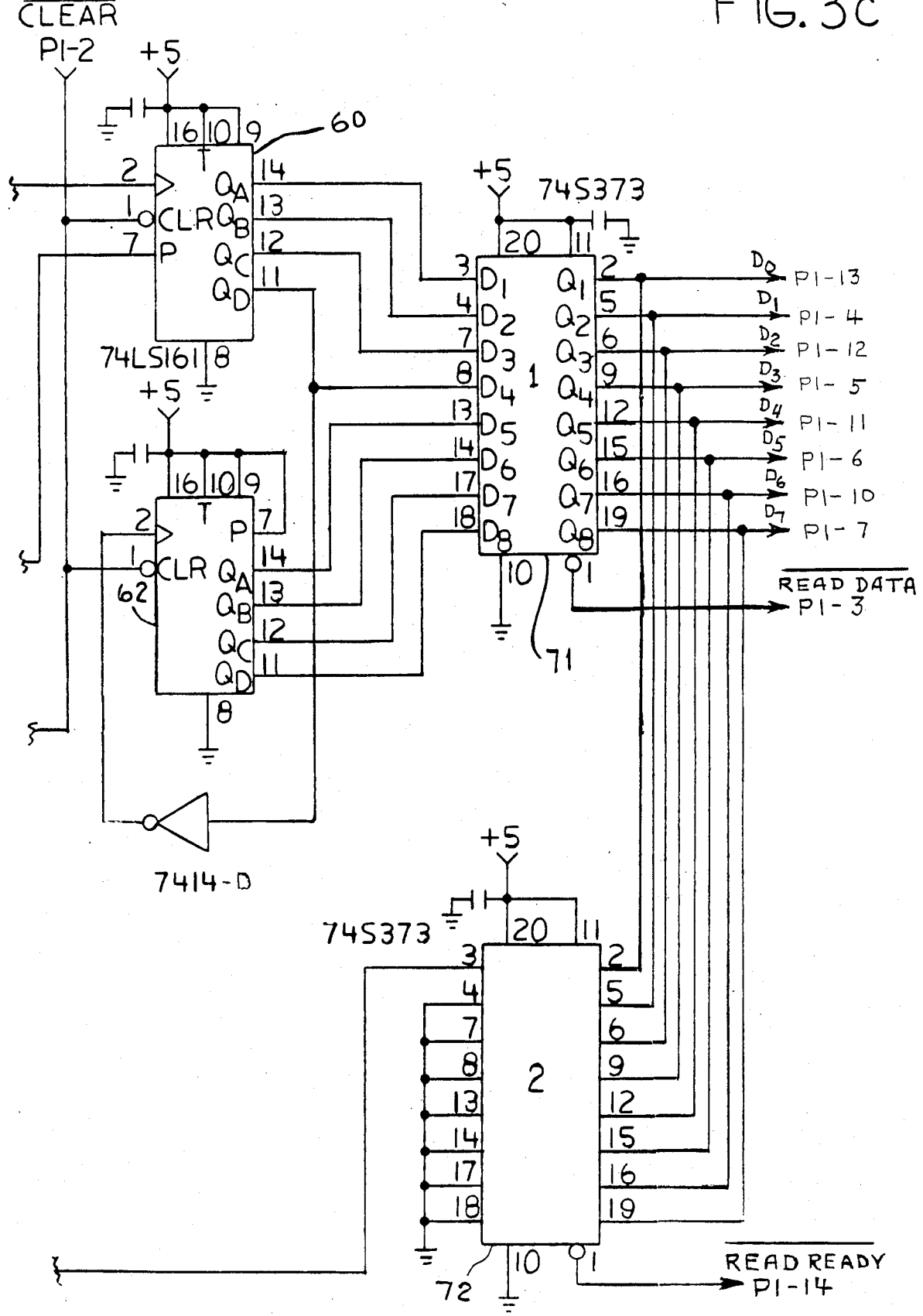

In FIG. 3 there is shown the manner in which FIGS. 3a, 3b and 3c are combined to form a complete schematic diagram of the digital phase meter apparatus. As described with respect to FIG. 1, the digital phase meter apparatus receives three analog input signals which are, respectively, the CLOCK signal, the SIGNAL-A, and the REFERENCE signal. In FIG. 3a, there is shown the CLOCK signal and the SIGNAL-A signal being respectively applied to high speed differential voltage comparator (LM361) units 50, 52. FIG. 3b, shows the REFERENCE signal applied to a high speed differential voltage comparator (LM361) unit 54. The outputs of units 50, 52, and 54 are respectively connected to dual differential line receiver (UA9637) units 56a, 56b and 56c. The combination of the differential voltage comparator (LM361) and the dual differential line receiver (UA9637) comprise the signal squaring units of FIG. 1. There are five digital control lines which are utilizes in the digital phase meter apparatus. These digital control signals are designated $\overline{START}$, $\overline{CLEAR}$, $\overline{READ\ READY}$ and $\overline{READ\ DATA}$. The clock input, which can be as high as 40 MHz, is used to synchronize and drive the digital components in the circuit. The SIGNAL-A and REFERENCE inputs are the two signals between which the phase difference is measured. The data acquisition and phase measurement which is performed by the digital phase meter apparatus is divided into four basic functions which are: Signal Squaring, Leading-Edge Detection, Phase Measurement, and Digital Conversion. The sequence and explanation of these basic functions will be described with respect to FIGS. 3a-3c. In addition, reference will be made to FIG. 1 wherein the simplicity of that Figure will provide a further aid.

The signal squaring function will be readily understood with respect to FIG. 1 wherein the clock signal, reference input signal are applied to the signal squaring units 10, 12, 14 respectively. Each of the signal squaring units 10, 12, 14 comprise, as indicated in FIG. 3a, 3b, an LM361 unit in combination with a UA9637 unit. The detailed schematic diagram for the digital phase meter apparatus circuit is shown in FIGS. 3a through 3c.

The CLOCK, SIGNAL, and REFERENCE input signals are sinusoidal waveforms with a typical amplitude of approximately 600 millivolts peak to peak. The SIGNAL-A is the input signal of which the phase is to be measured. In order to condition the SIGNAL-A for a more defined leading edge, a high speed differential voltage comparator (LM361) and a dual differential line receiver (UA9637) are used to square up and amplify the incoming signals to make them TTL compatible. FIG. 1 shows this function wherein three sine waves are applied respectively to the units 10, 12, 14 and the output signal is a well-defined square wave. The clock frequency, while higher than the SIGNAL and REFERENCE frequencies, should not exceed these frequencies by more than a multiple of 256. This is to ensure that the maximum phase difference measured can still be represented by an 8-bit output. The SIGNAL-A and REFERENCE signals should be of the same frequency.

The phase measurement process is accomplished in the leading edge/phase detection unit (FIG. 1, unit 16) which are part of integrated circuit unit 74S74 in FIGS. 3a, b and are labelled respectively units A, B, C and D. The integrated circuit unit 74S74 comprises a series of D flip-flops which are used to detect the leading edges of the SIGNAL-A and REFERENCE inputs. The edge detection process is initiated when the flip-flops A, B, D and the counters (units 60, 62) are cleared due to the strobing of the $\overline{Clear}$ control line (Pl-2 in Figure 3c). When the $\overline{Start}$ control line (Pl-15 in FIG. 3b) clocks flip-flop unit A, the flip-flop unit B goes high when the leading edge of the REFERENCE signal is detected (the leading edge clocks the flip-flop). The output of the flip-flop unit C, which is initially high, goes low when the leading edge of the SIGNAL-A input is detected. When the complement output of the flip-flop unit C goes high, the flip-flop unit D is clocked and a logical "1" is entered to the least significant bit input of latch 2 unit 20. In general, the flip-flop units B and C, in conjunction with the AND gate 58, act as a switch that is activated on the leading edge of the REFERENCE signal and is deactivated on the leading edge of the SIGNAL-A input. During this activation time, the counter unit (units 60, 62 in Figure 3c) is enabled and the CLOCK signal drives the counter unit 60, 62.

The phase measurement is accomplished by the operation of the flip-flop units B and C, the AND gate 58 and the counter units 60, 62. The time interval between the two positive leading edges of the SIGNAL-A and the REFERENCE signal specifies the phase difference. The AND gate 58 which is in the high state for the phase measurement duration, enables the counter units 60, 62 to accumulate a count which is representative of the phase differences between the two signals (the SIGNAL-A and the REFERENCE signal). As was earlier pointed out, the CLOCK signal continues to increment the counter units 60, 62 for the duration of the phase difference period. The measurement is completed when the leading edge detection units flip-flops B and C disables the counter units 60, 62.

The phase difference that is measured in the leading edge/phase detection unit is converted into an 8-bit binary number via two 4-bit cascaded counters. The output of the AND gate 58 is used to enable the counters 60, 62 for the duration of the phase difference. After the phase detection/measurement has been completed, a logical "1" is latched onto the least signficant bit of the 8-bit data bus output of latch 2 unit 72. When an external controller (e.g. microprocessor) strobes the READ READY line, the logical "1" is detected on the data bus and the controller can then strobe the READ DATA control line to read the phase data from the counter unit 60, 62 that had been latched in latch 1 unit 71.

Figure 4:
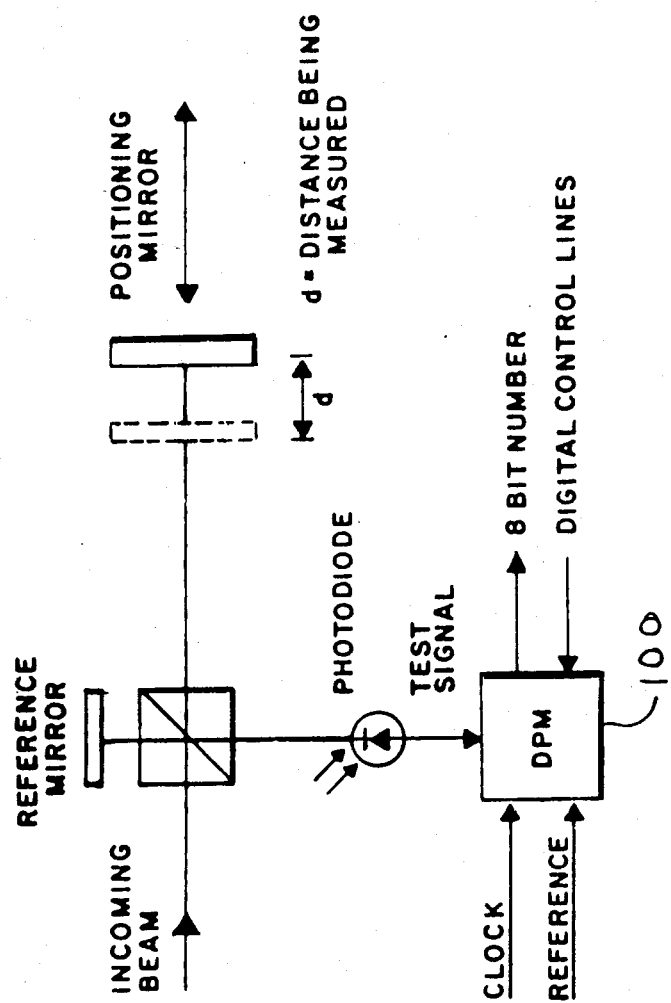

In FIG. 4 there is shown a phase delay measurement circuit in which the digital phase meter apparatus 100 is utilized. The operation of the digital phase measurement circuit is now described. For a generic phase measurement routine, the digital control lines are strobed (active low) as follows:

1. Clear: When Clear is strobed, flip-flop A, B, D and the counters are cleared.
2. Start: When Start is strobed, the circuit is initialized and initiates the phase measurement when the first positive leading edge of the Reference input is detected.
3. Read Ready: This line is continuously being monitored (strobed) by the microprocessor controller or controlling microcomputer and will put the least significant bit from latch on to the data bus.
4. Read Data: When this line is strobed, the output phase data from the tri-state latch 1 (units 74S373) can be read.

There is shown in Table 1 the input/output levels of the various flip-flops, the AND gate and the latches (components shown in FIG. 3c) when the digital phase meter conducts a phase measurement.

TABLE I

DIGITAL PHASE METER TRUTH TABLE

| Control Line Sequence | Control Line OR Input Signal | FLIP-FLOP INPUT/OUTPUT | | | | | | | | 'AND' GATE OUTPUT (enable counter) | DATA LINES |
|---|---|---|---|---|---|---|---|---|---|---|---|
| | | A D | A Q | B D | B Q | C Q | C D | D Q | D Q | | |
| 1 | CLEAR | H | L | L | H | L | H | L | H | H L | L | ALL LOW |
| 2 | START | H | H | H | H | L | H | L | H | H L | L | ALL LOW |
| | LEADING Edge of REFERENCE | H | H | H | L | H | L | L | H | H L | H | ALL LOW |
| | LEADING Edge of SIGNAL | H | H | H | L | H | L | H | L | H H | L | ALL LOW |
| 3 | READ READY | H | H | H | L | H | L | H | L | H H | L | Least Sign. BIT = H |
| 4 | READ DATA | H | H | H | L | H | L | H | L | H H | L | PHASE DATA WORD |

L = Logical '0'
H = Logical '1'
Dark bordered squares indicate at what step a transition takes place.

The following is a parts list for the digital phase meter:

| ITEM | PART NO. | PART NAME | QUAN. REQ. |
|---|---|---|---|
| 1 | 74LS161N | SYNCHRONOUS 4 BIT COUNTERS | 2 |
| 2 | SN74S373N | TRANSPARENT LATCHES | 2 |
| 3 | 74S74PC | DUAL D POSITIVE EDGE TRIGGERED FLIP-FLOPS WITH PRESET AND CLEAR | 2 |
| 4 | SN7408N | QUAD 2-INPUT AND GATES | 1 |
| 5 | UA9637ARC | DUAL DIFFERENTIAL LINE RECEIVER | 3 |
| 6 | LM361N | HIGH SPEED DIFFERENTIAL VOLTAGE COMPARATORS | 3 |
| 7 | DM7414N | HEX SCHMITT TRIGGER INVERTER | 2 |
| 8 | | 10K RESISTORS | 6 |
| 9 | | .1 mf CAPACITORS | 15 |
| 10 | | 5K 10 turn potentiometer | 1 |

Although the invention has been described with reference to a particular embodiment, it will be understood to those skilled in the art that the invention is capable of a variety of alternative embodiments within the spirit and scope of the appended claims.

What is claimed is:

1. A digital phase meter apparatus for measuring phase difference comprising in combination:

a first means for signal squaring to receive a clock signal, said first signal squaring means squaring said clock signal to provide a first clock signal, a second means for signal squaring to receive an input signal, said second signal squaring means squaring said input signal to provide a test signal, a third means for signal squaring to receive a reference signal, said third signal squaring means squaring said reference signal to provide a first reference signal, a means for leading edge/phase detection, said leading edge/phase detection means receiving said test signal and said first reference signal, said leading edge/phase detection means receiving a first and second control signal, said first control signal initiates the leading edge detection process, said second control signal starts the phase detection process, said leading edge/phase detection means providing an enable signal at the start of the phase detection process, said enable signal is activated for the entire time of the phase detection process, a means for counting bits, said bit counting means receiving said first clock signal from said signal squaring means, said bit counting means receiving said enable signal from said leading edge/phase detection means which enables said bit counting means and allows said first clock signal to drive said bit counting means, said first clock signal continues to increment said bit counting means for the duration of said enable signal, said bit counting means providing an n-bit output signal where n is a predetermined positive number, a first latch means operatively connected to said bit counting means to receive said n-bit output therefrom, said first latch means providing a first n-bit latch output signal to a data bus line, and, a second latch means operatively connected to said leading edge/phase detection means, said second latch means receiving a latch input signal from said leading edge/phase detection means, said second latch means providing a second n-bit latch output to said data bus line, said n-bit latch output signal including said latch input signal, said latch input signal on said data bus line signaling said third control signal, said third control signal activating said first latch means to read out said first n-bit latch output onto said data bus line, said first n-bit latch output signal comprising the phase difference between said input signal and said reference signal.

2. A digital phase meter apparatus as described in claim 1 wherein said bit counting means comprises a pair of four-bit cascaded counter units.

3. A digital phase meter apparatus as described in claim 1 wherein each of said first, second and third signal squaring means comprise a voltage comparator means in series with a dual differential line receiver means to square up and amplify their respective input signals to make them TTL compatible.

4. A digital phase meter apparatus as described in claim 1 wherein leading edge/phase detection means comprises a plurality of D flip-flop means, a first one of said plurality of D flip-flop means initiates said leading edge detection process, a second one starts the phase detection process, a third one indicates the end of the phase measurement, and a fourth one provides a phase measurement complete signal.

5. A digital phase meter apparatus as described in claim 1 wherein said enable signal is activated on the leading edge of said reference signal and is deactivated on the leading edge of said tests signal.

6. A digital phase meter apparatus as described in claim 1 wherein said n-bit output equals an 8-bit output.

* * * * *